United States Patent [19]

Bieniosek

[11] Patent Number: 4,833,431
[45] Date of Patent: May 23, 1989

[54] TRIPLE-RESONANCE PULSE TRANSFORMER CIRCUIT

[75] Inventor: Francis M. Bieniosek, Chesterfield, Mo.

[73] Assignee: McDonnell Douglas Corporation, Long Beach, Calif.

[21] Appl. No.: 156,958

[22] Filed: Feb. 18, 1988

[51] Int. Cl.[4] .................... H03H 11/00; H03K 12/00
[52] U.S. Cl. ..................................... 333/20; 307/106; 328/65; 333/23
[58] Field of Search ............ 333/19, 20, 23, 177–180, 333/185; 328/65–67, 74; 307/106, 161

[56] References Cited
U.S. PATENT DOCUMENTS
2,448,364  8/1948  Ganz et al. ............................ 333/20

Primary Examiner—Marvin L. Nassbaum
Attorney, Agent, or Firm—Benjamin Hudson, Jr.

[57] ABSTRACT

A triple resonance circuit is provided for improving the efficiency of high voltage pulses for pulse transformer applications. This circuit provides high transfer of energy when the normal mode frequencies of the coupled circuit are in the ratios of certain whole numbers.

8 Claims, 1 Drawing Sheet

TRIPLE-RESONANCE PULSE TRANSFORMER CIRCUIT

BACKGROUND OF THE INVENTION

1. Field of the Invention

This invention is related generally to resonant transformer circuits designed to generate high voltage pulses for such applications as linear induction accelerators, electromagnetic launchers, and particle beam accelerators.

2. Description of the Prior Art

In pulse power applications, the object of the designers is to place the maximum amount of voltage on the load capacitors with a high energy transfer efficiency. Author G. J. Rohwein, in his paper, "A Three Megavolt Transformer for PFL Pulse Charging", published in IEEE Transactions, Nuclear Science NS-26, 4211, 1979, introduced a transformer designed to operate in a dual resonance mode. The open circuit resonant frequencies of the primary and secondary transformer circuits are equal, and transformer coupling efficiency is 0.6. In this circuit, the coupling of the energy, neglecting dampening, takes place from $C_1$ to $C_2$. The concept of the dual resonant transformer circuit has been known since at least 1966, (see David Finkelstein, Philip Goldberg, and Joshua Suchatowitz, "High Voltage Impulse System", The Review of Scientific Instruments, vol. 37, p. 159 (1966)). Operation in the dual resonant mode has several disadvantages. First, the transformer acts as a pulse line with a different impedance from the actual pulse line, introducing an after pulse as the internal capacitance of the transformer discharges into the pulse line; and second, fault modes in the pulse line can produce dangerous high voltage spikes on the transformer's secondary. These disadvantages are commonly removed by the introduction of an external inductor to provide isolation between the pulse line and the transformer. However, the circuit does not couple 100% of the available energy into the pulse line. The remaining energy tends to ring in the transformer. Such ringing is undesirable because repeated undampened voltage reversals have a deleterious effect on transformer lifetime and insulation strength.

In a paper described by K. A. Zheltov, A. V. Malygin, M. G. Plickin, and V. F. Shalimanov entitled, "Miniature Voltage Pulse Generator For Sub-Nanosecond Electron Accelerators", Instruments and Experimental Techniques, Vol. 26, page 589, 1983, a resonant pulse generator circuit was disclosed, but did not address the problem of generating high energy transfer.

SUMMARY OF THE INVENTION

There is provided by this invention a resonant circuit for charging a pulse forming transmission line which allows high energy transfer while maintaining voltage isolation on a fast time scale between the transformer and the pulse line. This circuit transfers high peak voltage stresses from the transformer secondary to an external inductor, resulting in substantially higher output voltages that can be acheived for a given transformer.

BRIEF DESCRIPTION OF THE PREFERRED EMBODIMENT

Figure 1:
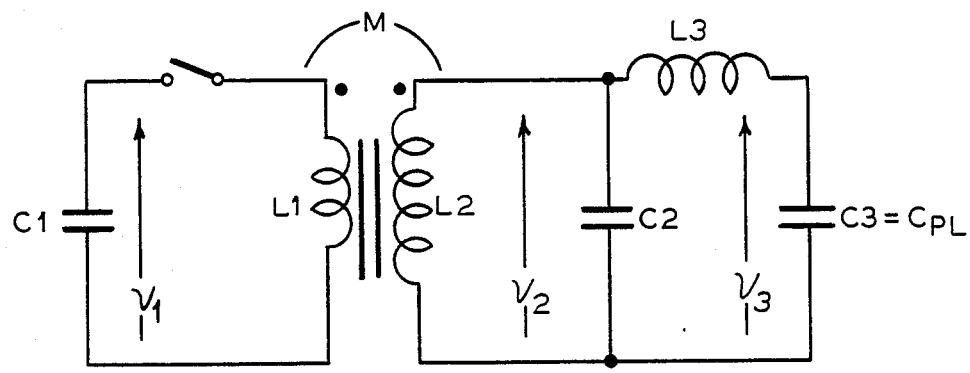
FIG. 1 is a resonant circuit incorporating the principles of this invention.

The circuit shown in FIG. 1 introduces an external capacitance in parallel with the internal capacitance of the transformer. The transformer is not shown, but will be known to those skilled in the art as an air-core spiral strip design as described in the publication by G. K. Rohwein, "A three mega-volt transformer for PFL pulse charging"IEEE Transactions, Nuclear Science NS-26,4211, 1979. The circuit introduces an external capacitance in parallel with the internal capacitance for the transformer to form capacitance $C_2$ of FIG. 1. This capacitance, in conjunction with the external inductance $L_3$, forms a resonant circuit that can support any of numerous resonant modes that transfer substantially all the energy initially stored in capacitance $C_1$ to $C_3$. This circuit is resonant when the three normal mode radiant frequencies $\omega_1 = k\omega_0$, $\omega_2 = \omega_0$, and $\omega_3 = m\omega_0$ in the ratio of whole numbers k, l, and m, where l is equal to $k+1, k+3, k+5, \ldots$ and m is equal to $l+1, l+3,$ and $l+5, \ldots$ . The simplest operating mode, which is also the mode of greatest practical interest, is that in which the three normal mode frequencies of the coupled circuit are in the ratios 1:2:3. The parameters for the circuit component values are as follows:

TABLE 1

| | Triple resonance circuit parameters | |
|---|---|---|
| Parameter | 1:2:3 mode | General mode k:l:m |
| $\omega_0^2 L_1 C_1$ | $\dfrac{11}{24}$ | $\dfrac{1 + l^2 P_3}{2}$ |
| $\omega_0^2 L_2 C_2$ | $\dfrac{4}{9}$ | $\dfrac{(1 - k^2 P_3/k_m^2)(P_2 - P_1 P_3 k^2) - P_1 P_3^2 k^4}{P_2 k^2 (1 + P_3 k^2 (1 - 1/k_m^2)}$ |
| $\omega_0^2 L_3 C_3$ | $\dfrac{1}{4}$ | $\dfrac{1}{l^2}$ |
| $k_m^2 = \dfrac{M^2}{L_1 L_2}$ | $\dfrac{5}{11}$ | $\dfrac{l^2 P_3}{1 + l^2 P_3}$ |
| $L_2/L_3$ | $\dfrac{5}{6}$ | $l^2 P_3$ |

TABLE 1-continued

| Parameter | Triple resonance circuit parameters | |
|---|---|---|
| | 1:2:3 mode | General mode k:l:m |
| $C_2/C_3$ | $\frac{32}{15}$ | where $P_1 = \left(\frac{m^2 - l^2}{m^2 - k^2}\right)$, $P_2 = P_1\left(\frac{l^2 k^2}{l^2}\right)$, and $P_3 = \frac{P_2}{2}\left(\frac{1}{k^2} - \frac{1}{m^2}\right) = \omega_0^2 L_2 C_3$ |

Typical component values for a triple resonance circuit within the parameters discussed above are:
$L_1 = 0.93$ uH
$L_2 = 675$ uH
$L_3 = 810$ uH
$M = 16.9$ uH
$C_1 = 0.2$ uf
$C_2 = 267$ pf
$C_3 = 125$ pf These circuit values may vary within the 10-20% range. The triple resonant circuit built to these specifications is superior to other resonant circuits in that the peak pulse line voltage is enhanced over the peak transformer voltage by a factor of 2.77 having a power transfer efficiency of greater than 90%. This circuit will allow higher output voltages to be acheived for any given size transformer. Further, extensions to the circuit design based on higher resonant mode numbers than 1:2:3, such as 1:2:5, may also be useful. Design equations for all modes are given on Table 1.

Figure 2:
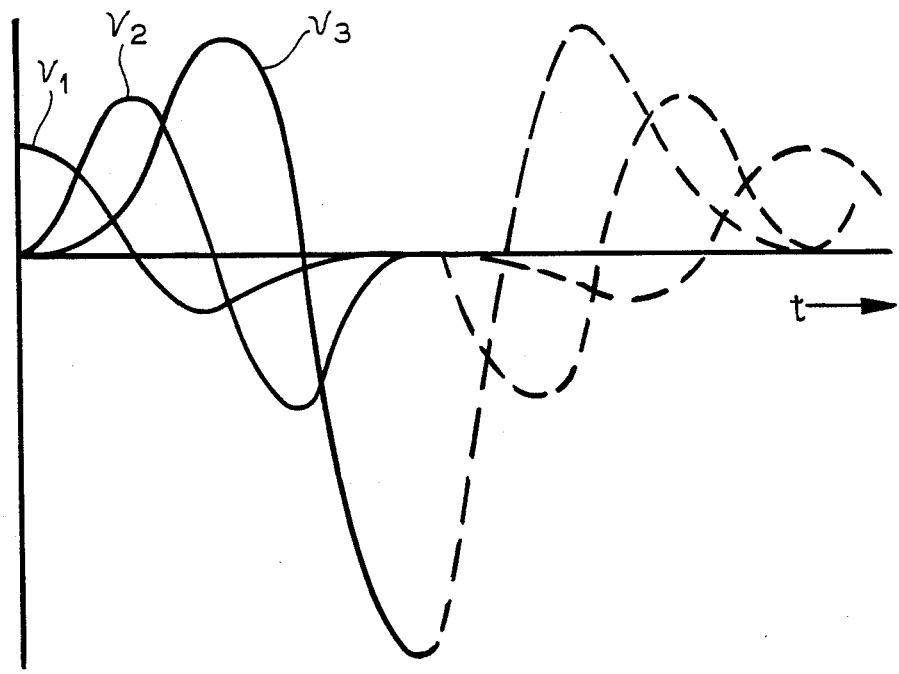
FIG. 2 illustrates the waveforms for capacitor voltages in the resonant circuit incorporating the principles of this invention.

FIG. 2 illustrates the waveforms for the capacitor voltages. Voltage waveforms, up to the time of maximum voltage V, are shown in solid lines. The transferred energy may be extracted from $C_3$ at this time. The voltage waveforms that would occur after this time if the energy is not extracted are shown in dashed lines.

Although there has been illustrated and described specific detail and structure of operation, it is clearly understood that the same were merely for purposes of illustration and that changes and modifications may be readily made therein by those skilled in the art without departing from the spirit and scope of the invention.

What is claimed:

1. A resonant circuit for a high voltage transformer, comprising:
    (a) a first capacitance connected across the input of a high voltage transformer;
    (b) a second capacitance connected across the output of the high voltage transformer;
    (c) an external inductance connected in a branch parallel with the second capacitance having a value such that the ratio of the internal secondary inductance of the high voltage transformer to the external inductance is substantially 5/6; and
    (d) a third capacitance serially connected to the external inductance having a value such that the ratio of the second capacitance to the third capacitance is substantially 32/15.

2. A resonant circuit for a high voltage transformer as recited in claim 1 wherein the transformer primary inductance is substantially 0.93 uH.

3. A resonant circuit for a high voltage transformer as recited in claim 2 wherein the transformer secondary inductance is substantially 675 uH.

4. A resonant circuit for a high voltage transformer as recited in claim 3 wherein the external inductance is substantially 810 uH.

5. A resonant circuit for a high voltage transformer as recited in claim 4 wherein the mutual inductance is substantially 16.9 uH.

6. A resonant circuit for a high voltage transformer as recited in claim 5 wherein the first capacitance is substantially 0.2 uf.

7. A resonant circuit for a high voltage transformer as recited in claim 6 wherein the second capacitance is substantially 267 pf.

8. A resonant circuit for a high voltage transformer as recited in claim 7 wherein the third capacitance is substantially 125 pf.

* * * * *